(12) United States Patent
Cui et al.

(10) Patent No.: US 12,237,363 B2
(45) Date of Patent: Feb. 25, 2025

(54) LIGHT SOURCE MODULE AND DISPLAY DEVICE

(71) Applicant: TCL CHINA STAR OPTOELECTRONICS TECHNOLOGY CO., LTD., Guangdong (CN)

(72) Inventors: Zhengbo Cui, Guangdong (CN); Hongzhao Deng, Guangdong (CN); Jing Liu, Guangdong (CN); Hao Chen, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 17/622,816

(22) PCT Filed: Dec. 17, 2021

(86) PCT No.: PCT/CN2021/139193
§ 371 (c)(1),
(2) Date: Dec. 25, 2021

(87) PCT Pub. No.: WO2023/108617
PCT Pub. Date: Jun. 22, 2023

(65) Prior Publication Data
US 2024/0030273 A1 Jan. 25, 2024

(30) Foreign Application Priority Data
Dec. 13, 2021 (CN) .......................... 202111523198.8

(51) Int. Cl.
*H01L 27/15* (2006.01)
*H01L 33/62* (2010.01)

(52) U.S. Cl.
CPC ............ *H01L 27/156* (2013.01); *H01L 33/62* (2013.01)

(58) Field of Classification Search
CPC ................. H01L 27/156; H01L 25/167; G02F 1/133603; G09F 9/33
See application file for complete search history.

(56) References Cited

U.S. PATENT DOCUMENTS

2018/0218670 A1 8/2018 Huska et al.
2021/0256899 A1* 8/2021 Kao ....................... H01L 25/167
(Continued)

FOREIGN PATENT DOCUMENTS

CN 111477176 A * 7/2020 ............... G09G 3/20
CN 111599306 A 8/2020
(Continued)

OTHER PUBLICATIONS

Google patent search.*
(Continued)

*Primary Examiner* — Mamadou L Diallo
(74) *Attorney, Agent, or Firm* — PV IP PC; Wei Te Chung

(57) ABSTRACT

A light source module and a display device include a substrate configured to have a plurality of light-emitting regions arranged in an array manner, each light-emitting region is provided with two light-emitting groups, each light-emitting group includes a plurality of light-emitting branches arranged side by side, and two driving chips are disposed in parallel between the two light-emitting groups; and single-layer layout wiring arranged on the substrate, wherein the single-layer layout wiring couples the driving chips within the light-emitting regions to each other and electrically connects each of the driving chips to the light-emitting branches within one of the light-emitting groups.

16 Claims, 5 Drawing Sheets

(56) References Cited

U.S. PATENT DOCUMENTS

| | | |
|---|---|---|
| 2021/0343213 A1 | 11/2021 | Zhang |
| 2022/0053615 A1* | 2/2022 | Hao ........................ G09G 3/32 |
| 2023/0122312 A1* | 4/2023 | Jung ........................ G09G 3/32 |
| | | 345/204 |
| 2023/0387140 A1* | 11/2023 | Wang .................... H01L 27/124 |
| 2024/0047506 A1* | 2/2024 | Shim ...................... H01L 33/38 |
| 2024/0170628 A1* | 5/2024 | Liu ......................... H01L 33/62 |
| 2024/0194842 A1* | 6/2024 | Wang .................... H01L 25/167 |

FOREIGN PATENT DOCUMENTS

| | | | | |
|---|---|---|---|---|
| CN | 111710312 A | | 9/2020 | |
| CN | 111752407 A | | 10/2020 | |
| CN | 111965891 A | * | 11/2020 | ....... G02F 1/133603 |
| CN | 112133244 A | | 12/2020 | |
| JP | 2018517290 A | | 6/2018 | |
| JP | 2018523314 A | | 8/2018 | |
| JP | 2018530792 A | | 10/2018 | |
| JP | 2020506544 A | | 2/2020 | |
| WO | 2019146634 A1 | | 8/2019 | |
| WO | WO-2023028938 A1 | * | 3/2023 | ......... H01L 25/0753 |

OTHER PUBLICATIONS

International Search Report in International application No. PCT/CN2021/139193, mailed on Sep. 15, 2022.
Written Opinion of the International Search Authority in International application No. PCT/CN2021/139193, mailed on Sep. 15, 2022.
Chinese Office Action issued in corresponding Chinese Patent Application No. 202111523198.8 dated Jul. 25, 2022, pp. 1-6.
Japanese Office Action issued in corresponding Japanese Patent Application No. 特願2021-576903 dated Dec. 3, 2024, pp. 1-4.

* cited by examiner

LIGHT SOURCE MODULE AND DISPLAY DEVICE

FIELD OF INVENTION

The present disclosure relates to the technical field of display, and specifically to a light source module and a display device.

BACKGROUND OF INVENTION

Sub-millimeter light-emitting diodes (Mini LED) refer to light-emitting diodes with a die (chip) size of 50 to 200 microns. The application direction includes Mini LED direct display and Mini LED backlight display devices. Display devices adopting Mini LED technology have advantages such as long life and a screen being not easy to burn.

In Mini LED backlight display devices, it is necessary to integrate a larger number of Mini LEDs, which makes the thickness of the light source module not easy to be thin, and also generates more heat. Although there have been some light source modules based on two or more layers of metal wiring in the past, this wiring manner has problems such as easy short-circuit between different metal layers and high cost, which still needs to be improved.

SUMMARY OF INVENTION

The present disclosure provides a light source module and a display device, which are used to overcome problems caused by a light source module with two or more layers of metal wiring in the prior art.

To solve the above-mentioned problems, a first aspect of the present disclosure provides a light source module, which includes a substrate configured to have a plurality of light-emitting regions arranged in an array manner, wherein each of the light-emitting regions of the substrate is provided with two light-emitting groups, each of the light-emitting groups includes a plurality of light-emitting branches arranged side by side, and two driving chips are disposed in parallel between the two light-emitting groups; wherein the two driving chips are centrally symmetrically arranged; and single-layer-layout wiring arranged on the substrate, wherein the single-layer-layout wiring couples the driving chips within the light-emitting regions to each other and electrically connects each of the driving chips to the light-emitting branches within one of the emitting groups; wherein each of the light-emitting branches includes one sub-millimeter light-emitting diode, alternatively, each of the light-emitting branches includes at least two sub-millimeter light-emitting diodes, wherein the at least two sub-millimeter light-emitting diodes are connected in parallel or in series.

According to an embodiment of the present disclosure, each of the driving chips includes a ground pin, at least one power pin, a variety of function pins, and a plurality of output pins, wherein the ground pins of the two driving chips within each of the light-emitting regions are close to each other, and the output pins are close to the light-emitting branches within one of the light-emitting groups.

According to an embodiment of the present disclosure, the single-layer-layout wiring is configured to make each of the output pins within each of the light-emitting regions be coupled to one end of one of the light-emitting branches within the same light-emitting region, the other end of each of the light-emitting branches within the light-emitting regions be coupled to each other, the ground pin within each of the light-emitting regions be coupled to each other, the power pin within each of the light-emitting regions be coupled to each other, and the same or corresponding function pins within the light-emitting regions be respectively coupled.

According to an embodiment of the present disclosure, the light-emitting branches are arranged side by side in a first direction, the single-layer-layout wiring is further configured to form a ground wire part, and the ground wire part extends in the first direction between the two driving chips to be coupled to the ground pins within the light-emitting regions.

According to an embodiment of the present disclosure, the single-layer-layout wiring is further configured to form two light source wire parts, and each of the light source wire parts extends in the first direction on one side of the light-emitting groups away from the driving chips to be coupled to the light-emitting branches within the light-emitting regions.

According to an embodiment of the present disclosure, the single-layer-layout wiring is further configured to form two power wire parts, and each of the power wire parts extends in the first direction between the ground wire part and one of the light source wire parts to be coupled to the power pins within the light-emitting regions.

According to an embodiment of the present disclosure, the single-layer-layout wiring is further configured to form a variety of function wire parts, and the function wire parts extend in the first direction between the two light-emitting groups to be coupled to the same or corresponding function pins within the light-emitting regions.

To solve the above problems, a second aspect of the present disclosure provides a light source module, which includes: a substrate configured to have a plurality of light-emitting regions arranged in an array manner, wherein each of the light-emitting regions is provided with two light-emitting groups, each of the light-emitting groups includes a plurality of light-emitting branches arranged side by side, and two driving chips are disposed in parallel between the two light-emitting groups; and single-layer-layout wiring arranged on the substrate, wherein the single-layer-layout wiring couples the driving chips within the light-emitting regions to each other and electrically connects each of the driving chips to the light-emitting branches within one of the emitting groups.

According to an embodiment of the present disclosure, each of the driving chips includes a ground pin, at least one power pin, a variety of function pins, and a plurality of output pins, wherein the ground pins of the two driving chips within each of the light-emitting regions are close to each other, and the output pins are close to the light-emitting branches within one of the light-emitting groups.

According to an embodiment of the present disclosure, the single-layer-layout wiring is configured to make each of the output pins within each of the light-emitting regions be coupled to one end of one of the light-emitting branches within the same light-emitting region, the other end of each of the light-emitting branches within the light-emitting regions be coupled to each other, the ground pin within each of the light-emitting regions be coupled to each other, the power pin within each of the light-emitting regions be coupled to each other, and the same or corresponding function pins within the light-emitting regions be respectively coupled.

According to an embodiment of the present disclosure, the light-emitting branches are arranged side by side in a first direction, the single-layer-layout wiring is further configured to form a ground wire part, and the ground wire part extends in the first direction between the two driving chips to be coupled to the ground pins within the light-emitting regions.

According to an embodiment of the present disclosure, the single-layer-layout wiring is further configured to form two light source wire parts, and each of the light source wire parts extends in the first direction on one side of the light-emitting groups away from the driving chips to be coupled to the light-emitting branches within the light-emitting regions.

According to an embodiment of the present disclosure, the single-layer-layout wiring is further configured to form two power wire parts, and each of the power wire parts extends in the first direction between the ground wire part and one of the light source wire parts to be coupled to the power pins within the light-emitting regions.

According to an embodiment of the present disclosure, the single-layer-layout wiring is further configured to form a variety of function wire parts, and the function wire parts extend in the first direction between the two light-emitting groups to be coupled to the same or corresponding function pins within the light-emitting regions.

According to an embodiment of the present disclosure, the two driving chips are centrally symmetrically arranged.

According to an embodiment of the present disclosure, each of the light-emitting branches includes one sub-millimeter light-emitting diode; alternatively, each of the light-emitting branches includes at least two sub-millimeter light-emitting diodes, wherein the at least two sub-millimeter light-emitting diodes are connected in parallel or in series.

To solve the above problems, a third aspect of the present disclosure provides a display device, which includes a display screen and the light source module as mentioned above, wherein the light source module is connected to the display screen.

In the light source module and the display device of the present disclosure, the substrate is configured to have a plurality of light-emitting regions arranged in an array manner, wherein each of the light-emitting regions is provided with two light-emitting groups, each of the light-emitting groups includes a plurality of light-emitting branches arranged side by side, and two driving chips are disposed in parallel between the two light-emitting groups; and single-layer-layout wiring arranged on the substrate, wherein the single-layer-layout wiring couples the driving chips within the light-emitting regions to each other and electrically connects each of the driving chips to the light-emitting branches within one of the emitting groups. Therefore, backlight products with sub-millimeter light-emitting diodes driven by chips can be achieved based on the design of single-layer metal wiring. For example, the two driving chips are centrally symmetrically arranged, wherein the ground pins of the two driving chips are close to each other, and the output pins are close to the light-emitting branches within one of the light-emitting groups. Compared with the light source module based on two or more layers of metal wiring in the prior art, the present disclosure can avoid problems of circuits easily shorted between different metal layers and high cost. It can not only reflect product competitiveness but also reduce costs and improve product yield.

BRIEF DESCRIPTION OF DRAWINGS

To more clearly describe the technical solutions in the embodiments of the present disclosure, the accompanying drawings used in the description of the embodiments will be briefly introduced as follows. Obviously, the accompanying drawings in the following description are only some embodiments of the present disclosure. Other drawings can be obtained based on these drawings without creative work for those skilled in the art.

DETAILED DESCRIPTION OF PREFERRED EMBODIMENTS

Figure 1:
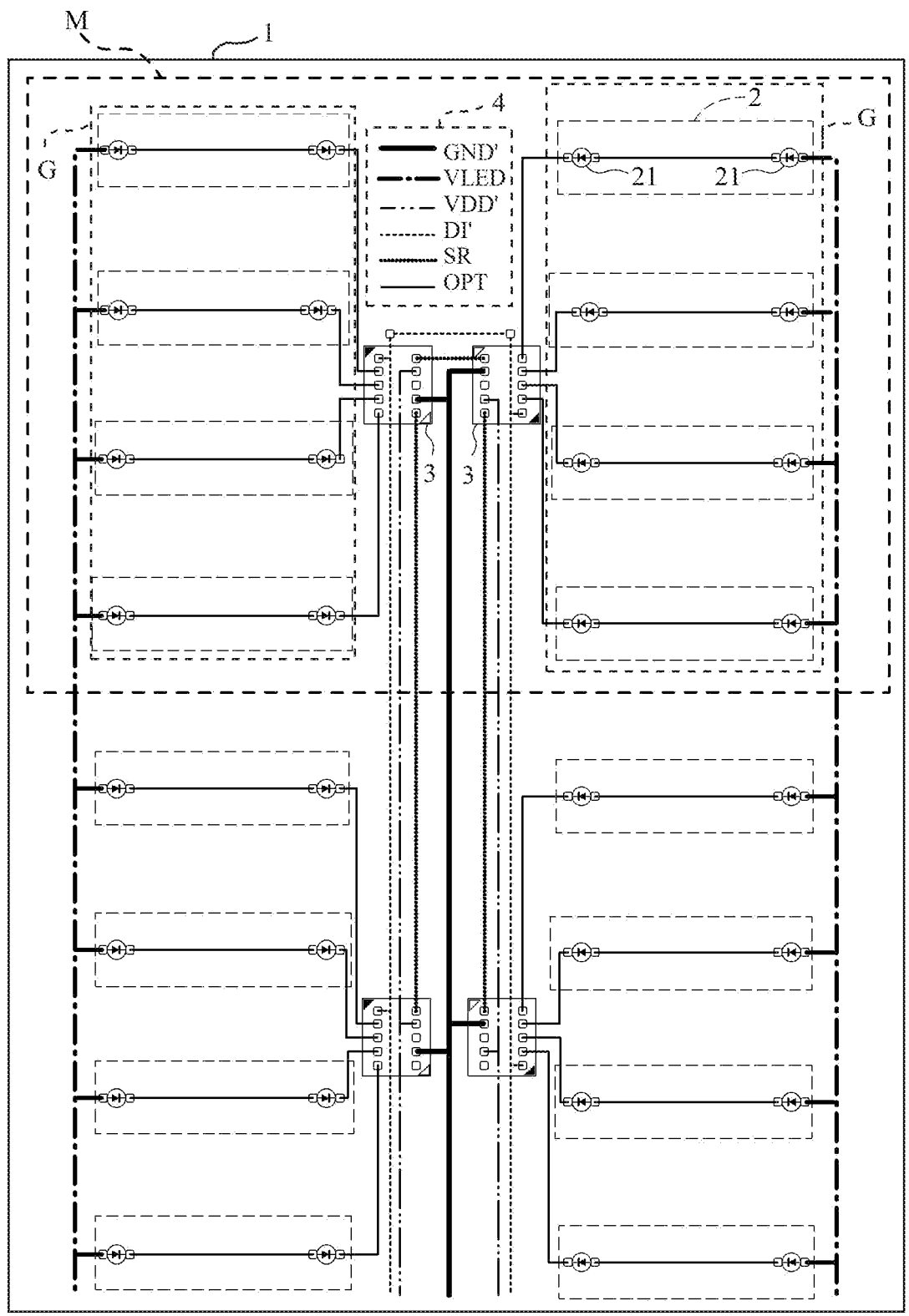
FIG. 1 is a schematic circuit diagram of a light source module according to a first embodiment of the present disclosure.

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without creative work shall fall within the protection scope of the present disclosure.

In the description herein, it should be understood that the terms, such as "central," "longitudinal," "lateral," "length," "width," "thickness," "upper," "lower," "front," "back," "left," "right," "vertical," "horizontal," "top," "bottom," "inner," "outer," "clockwise," and "counterclockwise" indicating a directional or positional relationship, are based on orientation or positional relationship shown in the drawings. Also, the terms are only for the convenience of describing the present disclosure and simplifying the description and do not indicate or imply that the device or element referred to has a specific orientation and is constructed and operated in a specific orientation. Therefore, it cannot be understood as a limitation to the present disclosure.

In the description herein, it should be understood that the terms "first" and "second" are only used for descriptive purposes and cannot be understood as indicating or implying relative importance or implicitly indicating the number of indicated technical features. Therefore, the features defined with "first" and "second" may explicitly or implicitly include one or more of the features. In the description of the present disclosure, "plurality" means two or more than two, unless specifically defined otherwise.

Many different embodiments or examples are provided herein to realize the different structures of the present disclosure. To simplify the disclosure of the present disclosure, the components and settings of specific examples are described below. Certainly, they are only examples, and the purpose is not to limit the present disclosure. In addition, the present disclosure may repeat reference numbers and/or reference letters in different examples, and this repetition is used for the purpose of simplification and clarity and does not indicate the relationship between the various embodiments and/or settings discussed. In addition, examples of various specific processes and materials are provided herein, but those ordinarily skilled in the art may be aware of the application of other processes and/or the use of other materials.

In a display device, a light source module can be designed based on single-layer-layout wiring technology, e.g., to realize the dual-column loading for a single data channel, in which a light source driving design does not require other peripheral auxiliary devices except light-emitting units and driving chips. Examples are described as follows but are not limited to the description here.

The embodiment of the present disclosure provides a light source module, which can be applied to a display device with various types of light-emitting diodes. For example, the light source module can be used in display devices using sub-millimeter light-emitting diodes (Mini LED) as backlight sources, such as liquid crystal display devices, but is not limited to the description here. The light source module can also be used in display devices using sub-millimeter light-emitting diodes as direct display light sources, such as Mini LED display screens. Further, in addition to the display device, the light source module can be applied to other products, such as lighting equipment. It should be understood that the light-emitting diode can generate a spectrum of a specific color, such as spectra of red, green, and blue.

As shown in FIG. 1, in a first embodiment of the light source module, the light source module includes a substrate 1. The substrate 1 can be provided with a plurality of light-emitting branches 2, a plurality of driving chips 3, and single-layer-layout wiring 4. In the present example, in order to simplify the description, it is only exemplified that the light source module can be configured as a surface light source, such as a backlight source or a direct display light source, according to light-emitting requirements of display devices.

The following examples illustrate an implementation in which the light source module is applied as a backlight module, but is not limited to the description here.

For example, in an embodiment, as shown in FIG. 1, the substrate 1 may be a glass substrate, a printed circuit board (PCB) substrate, or a BT resin substrate, but is not limited to the description here. For example, the substrate 1 can be configured to have a plurality of light-emitting regions M arranged in an array manner. Each of the light-emitting regions M is provided with two light-emitting groups G. Each of light-emitting groups G includes a plurality of light-emitting branches 2 arranged in parallel. For example, the light-emitting branches 2 are arranged side by side in a first direction (which is illustrated as a vertical direction from top to bottom in FIG. 1). Here, only four light-emitting branches 2 are taken as an example, but are not be limited to the description here. In addition, each of the light-emitting branches 2 includes at least one sub-millimeter light-emitting diode 21, e.g., a plurality of sub-millimeter light-emitting diodes 21 can be connected in series, in parallel, or in series and parallel, so that the light-emitting branch 2 can be a luminous form of one light, two lights, four lights, six lights, eight lights, ten lights, twelve lights, fourteen lights, or sixteen lights. Only luminous form of two lights is taken as an example, that is not limited to the description here. In addition, there are two driving chips 3 arranged in parallel between the two light-emitting groups G. For example, the two driving chips 3 are arranged side by side between the two light-emitting groups G in a longitudinal direction. For example, the size of the driving chip 3 is preferably less than 1500*1500 microns (μm) but is not limited to the description here.

Figure 2:
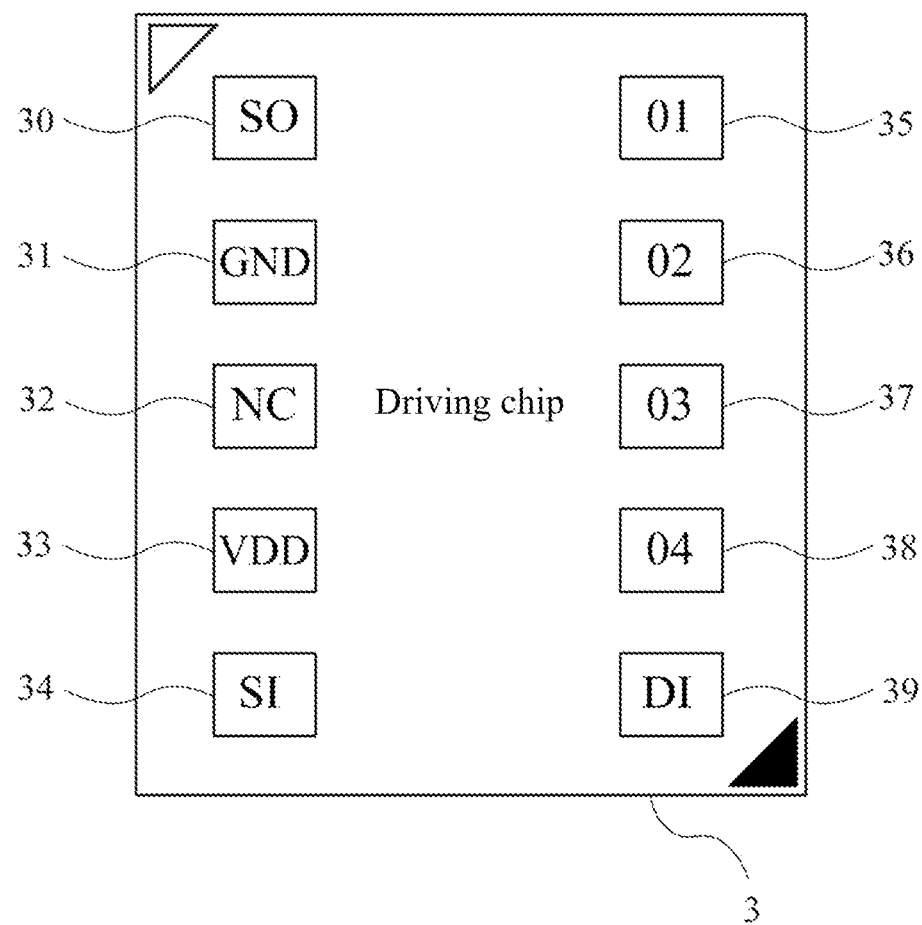
FIG. 2 is a schematic diagram of pins assignment of the driving chip in the first embodiment of the present disclosure.

In an example, as shown in FIG. 2, e.g., each driver chip 3 includes ten pins, such as a pin 30 being a serial output (shown as SO) pin, a pin 31 being a ground (shown as GND) pin, a pin 32 being a reserved (shown as NC) pin, a pin 33 being a power supply (shown as VDD) pin, a pin 34 being a serial input (shown as SI) pin, pins 35, 36, 37, and 38 being four output (shown as 01, 02, 03, 04) pins, and a pin 39 being a data input (shown as DI) pin. For example, the pins 30 to 34 and the pins 35 to 39 are arranged on two opposite sides of the driver chip 3 but are not limited to the description here.

In this example, as shown in FIGS. 1 and 2, each driver chip 3 includes a ground (shown as "GND") pin 31, a power supply (shown as "VDD") pin 33, a plurality of function (shown as "SO," "SI," and "DI") pins 30, 34, 39, and a plurality of output (shown as "01," "02," "03," and "04") pins 35, 36, 37, 38. The ground (shown as "GND") pins 31 of the two driving chips 3 are close to each other, the output (shown as "01," "02," "03," and "04") pins 35 to 38 of one of the single driving chips 3 are close to the light-emitting branches 2 within one of the light-emitting groups G.

In this example, as shown in FIGS. 1 and 2, the single-layer-layout wiring 4 can be configured to make each of the output (shown as "01," "02," "03," and "04") pins 35, 36, 37, and 38 be coupled to one end of one of the light-emitting branches 2 within a same light-emitting region M, the other end of each of the light-emitting branches 2 within the light-emitting regions M be coupled to each other, the ground (shown as "GND") pin 31 within the light-emitting regions M be coupled to each other, the power (shown as "VDD") pin 33 within the light-emitting regions M be coupled to each other, and the same or corresponding function (shown as "SO," "SI," or "DI") pins 30, 34, or 39 within the light-emitting regions M be respectively coupled.

For example, as shown in FIG. 1, the single-layer-layout wiring 4 can also be configured to form a ground wire part GND', wherein the ground wire part GND' extends in the first direction (for example, as shown in FIG. 1, the vertical direction from top to bottom) between the two driving chips 3 to be coupled to the ground (shown as "GND") pins 31 of the driving chips 3 within the light-emitting regions M. For example, the ground wire part GND' includes a first ground segment (such as a longitudinal segment shown in the figure) and a plurality of second ground segments (such as horizontal segments shown in the figure). The first ground segment extends in the first direction between the two driving chips 3, the second ground segments extend in a second direction (e.g., as shown in FIG. 1, the horizontal direction from left to right) between the two driving chips 3 to be coupled to the ground (shown as "GND") pins 31.

For example, as shown in FIG. 1, the single-layer-layout wiring 4 can also be configured to form two light source wire parts VLED. Each light source wire part VLED extends in the first direction on one side of the light-emitting groups G away from the driving chips 3 to be coupled to the light-emitting branches 2 within the light-emitting regions M.

For example, as shown in FIG. 1, the single-layer-layout wiring 4 can also be configured to form two power wire parts VDD'. Each of power wire parts VDD' extends in the first direction between the ground wire part GND' and one of the light source wire parts VLED to be coupled to the power (shown as VDD) pins 33 of the driving chips 3 within the light-emitting regions M.

For example, as shown in FIG. 1, the single-layer-layout wiring 4 can also be configured to form a variety of function wire parts, and the variety of function wire parts extend in the first direction between the two light-emitting groups to be coupled to the same or corresponding function pins within the light-emitting regions M. For example, a data input function wire part DI' is coupled to data input (shown as "DI") pins 39 of all the driving chips 3, wherein the data input function wire part DI' can also extend through a projection region of the two driving chips 3 on the substrate 1 to reduce the overall wiring range; a serial function wire part SR is coupled to all of serial output (shown as "SO") pins 30 and serial input (shown as "SI") pins 34 of the driver chips 3, so that the serial output (shown as "SO") pins 30 and the serial input (shown as "SI") pins 34 are connected in series. Thus, a set of data to drive two columns of driver chips can be realized.

It should be noted that, as shown in FIG. 1, the two driving chips 3 of the first embodiment are vertically arranged in parallel between the two light-emitting groups G, and the two driving chips 3 are centrally symmetrically arranged. For example, one driving chip 3 is rotated 180 degrees relative to the other driving chip 3, so that the same features of the two driving chips 3 are arranged side by side toward or away from each other, e.g., two marks (e.g., a solid triangle mark and a hollow triangle mark as shown in FIG. 1) are opposite, so that the output (shown as "01," "02," "03," and "04") pins 3538 of one of the driving chips 3 are close to the light-emitting branches 2 of one of the light-emitting groups G, the ground (shown as "GND") pins 31 of the two driving chips 3 are close to each other, so that the wiring (i.e., the ground wire part GND') coupled to the ground pins can be concentrated between the two driving chips 3, thereby reducing an area occupied by wiring.

Figure 3:
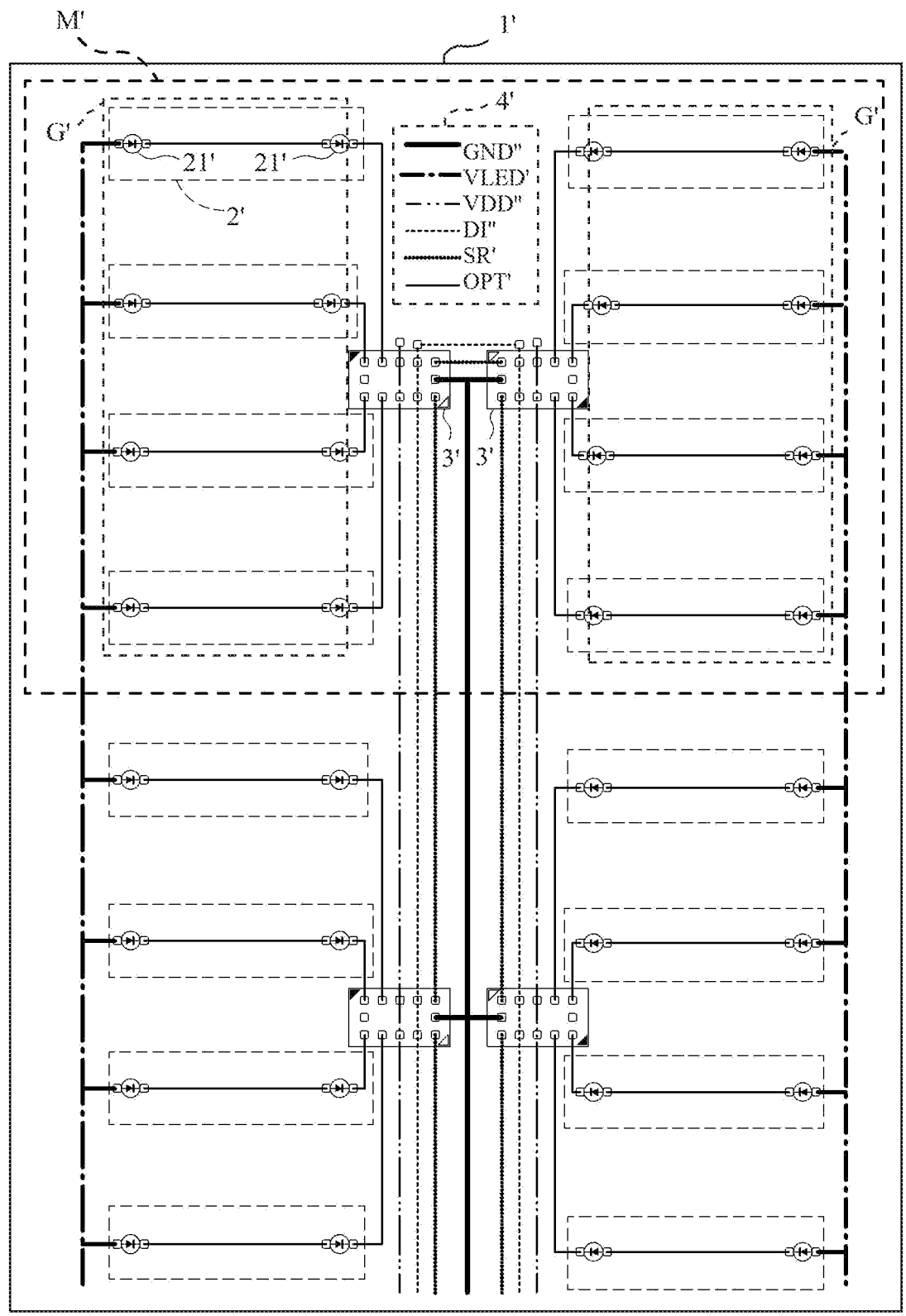
FIG. 3 is a schematic circuit diagram of a light source module according to a second embodiment of the present disclosure.

In addition, as shown in FIG. 3, in a second embodiment of the light source module, the light source module includes a substrate 1'. The substrate 1' can be provided with a plurality of light-emitting branches 2' and a plurality of driving chips 3', and a single-layer-layout routing 4'. In order to simplify the description, it is only exemplified that the light source module can be configured as a surface light source, such as a backlight source or a direct display light source, according to the light-emitting requirements of the display device. The implementation of the substrate 1' and the light-emitting branches 2' in the second embodiment is substantially the same as the implementation of the substrate 1 and the light-emitting branches 2 in the first embodiment. The substrate 1' can be configured to have a plurality of light-emitting regions M' arranged in an array manner. Each light-emitting region M' can be provided with two light-emitting groups G'. Each light-emitting group G' includes a plurality of light-emitting branches 2 arranged in parallel. The implementation content please be referred to the above description, and will not be repeated here.

It should be noted that a difference between the second embodiment and the first embodiment is that, as shown in FIG. 3, the two driving chips 3' of the second embodiment are laterally arranged in parallel between the two light-emitting groups G'. The two driving chips 3' are centrally symmetrically arranged.

Figure 4:
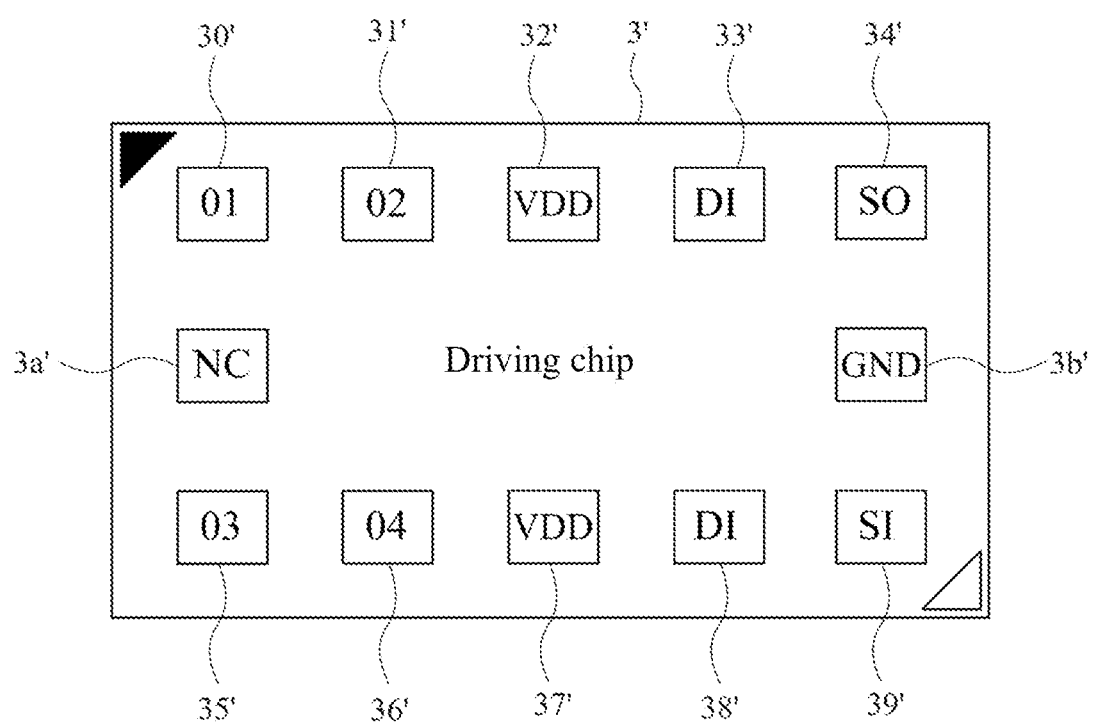
FIG. 4 is a schematic diagram of pins assignment of the driving chip in the second embodiment of the present disclosure.

In an example, as shown in FIG. 4, each driver chip 3' includes twelve pins, such as pins 30' and 31' being two output (shown as "01," and "02") pins, pins 32' and 37' being power (shown as "VDD") pins, pins 33' and 38' being data input (shown as "DI") pins, a pin 34' being a serial output (shown as "SO") pin, pins 35' and 36' being two output (shown as "03," and "04") pins, a pin 39' being a serial input (shown as "SI") pin, a pin 3a' being a reserved (shown as "NC") pin, and a pin 3b' being ground (shown as "GND") pin. For example, the pins 30' to 34' and pins 35' to 39' are arranged on both sides of the driver chip 3' (such as upper and lower sides), and the pin 3a' and the pin 3b' are located at two ends (such as left and right ends) of the driving chip 3, but are not limited to the description here.

In this example, as shown in FIGS. 3 and 4, each driver chip 3' includes a ground (shown as "GND") pin 3b', two power (shown as "VDD") pins 32', 37', a plurality of functions (shown as "DI," "SO," and "SI") pins 33', 34', 38', 39', and a plurality of output (shown as "01," "02," "03," and "04") pins 30', 31', 35', 36'. The ground (shown as "GND") pins 3b' of the two driving chips 3 are close to each other, and the output (shown as "01," "02," "03," and "04") pins 30', 31', 35', 36' of one of the driving chips 3 are close to the light-emitting branches 2' of one of the light-emitting group G'.

Correspondingly, as shown in FIG. 3, the single-layer-layout wiring 4' of the second embodiment is slightly different from the single-layer-layout wiring 4 of the first embodiment. For example, the single-layer-layout wiring 4' can also be configured to form a ground wire part GND", two light source wire parts VLED', two power wire parts VDD", and a variety of function wire parts, such as a data input function wire part DI" and a serial function wire part SR', wherein their wiring layout form can be changed according to positions of pins of the driver chip 3'.

For example, in this example, as shown in FIGS. 3 and 4, the single-layer-layout wiring 4' can be configured to make each of the output (shown as "01," "02," "03," "04") pins 31', 35', 36' be coupled to one end of one of the light-emitting branch 2' within a same light-emitting region M', and the other end of each of the light-emitting branches 2' within the light-emitting regions M' be coupled to each other, the ground (shown as "GND") pins 3b' within the light-emitting regions M' be coupled to each other, the power (shown as "VDD") pins 32' and 37' within the light-emitting regions M' be coupled to each other, and the same or corresponding function (shown as "DI," "SO," and "SI") pins 33', 34', 38', 39' within the light-emitting regions M' be respectively coupled. Thus, it is possible to realize a set of data to drive two columns of driver chips.

The following examples illustrate some embodiments of the light source module, but are not limited to the description here.

An aspect of the present disclosure provides a light source module, which includes: a substrate configured to have a plurality of light-emitting regions arranged in an array manner, wherein each of the light-emitting regions is provided with two light-emitting groups, each of the light-emitting groups includes a plurality of light-emitting branches arranged in parallel, and two driving chips are disposed in parallel between the two light-emitting groups; and single-layer-layout wiring is arranged on the substrate, wherein the single-layer-layout wiring couples the driving chips within the light-emitting regions to each other and electrically connects each of the driving chips to the light-emitting branches within one of the light-emitting groups. Therefore, by arranging the single-layer-layout wiring on the substrate and disposing the two driving chips in parallel between the two light-emitting groups, so that each of the driving chips drives the light-emitting branches within one of the light-emitting groups, to realize the dual-column loading for a single data channel, in which a backlight driving design does not require other peripheral auxiliary devices except light-emitting units and driver chips, which can reduce the number of used components and a layout area, simplify the processing process, and help reduce costs and improve product yield.

Optionally, in an embodiment, each of the driving chips includes a ground pin, at least one power pin, a variety of function pins, and a plurality of output pins, wherein the ground pins of the two driving chips within each of the light-emitting regions are close to each other, and the output pins are close to the light-emitting branches within one of the light-emitting groups. Therefore, the wiring for the ground can be concentratedly arranged between the two driving chips, which is beneficial to reduce the area occupied by the wiring, can reduce the cost, and improve the product yield.

Optionally, in an embodiment, the single-layer-layout wiring is configured to make each of the output pins within each of the light-emitting regions be coupled to one end of one of the light-emitting branches within the same light-emitting region, the other end of each of the light-emitting branches within the light-emitting regions be coupled to each other, the ground pins within the light-emitting regions be coupled to each other, the power pins within the light-emitting regions be coupled to each other, and the same or corresponding function pins within the light-emitting regions be coupled to each other. Therefore, the area occupied by the layout of the single-layer wiring can be greatly simplified, which can avoid short-circuiting between different metal layers and high cost can be avoided.

Optionally, in an embodiment, the light-emitting branches are arranged side by side in a first direction, and the single-layer-layout wiring is further configured to form a ground wire part, wherein the ground wire part extends in the first direction between the two driving chips to be coupled to the ground pins within the light-emitting regions. Therefore, by a ground-wire centralized layout, it is beneficial to reduce the cost and improve the product yield.

Optionally, in an embodiment, the single-layer-layout wiring is further configured to form two light source wire parts, wherein each of the light source wire parts extends in the first direction on one side of the light-emitting groups away from the driving chips to be coupled to the light-emitting branches within the light-emitting regions. Therefore, by arranging the two light source wire parts on the outside of the light-emitting branches, it is possible to avoid the mutual interference of the wiring, which is beneficial to improve the product yield.

Optionally, in an embodiment, the single-layer-layout wiring is further configured to form two power wire parts, and each of the power wire parts extends in the first direction between the ground wire part and one of the light source wire parts to be coupled to the power pins within the light-emitting regions. Therefore, by arranging the two power wire parts on both sides of the ground wire part, it is possible to avoid the mutual interference of the wiring and power supply, which is beneficial to improve the product yield.

Optionally, in an embodiment, the single-layer-layout wiring is further configured to form a plurality of function wire parts, wherein the function wire parts are extended in the first direction between the two light-emitting groups to be coupled to the same or corresponding function pins within the light-emitting regions. Therefore, by arranging the function wire parts between the two light-emitting groups, the redundant space after the driving chips are provided can be effectively used for wiring layout, which is beneficial to reduce cost and improve product yield.

Optionally, in an embodiment, the two driving chips are centrally symmetrically arranged. Therefore, by the different placement of the two driving chips, the wiring for the ground can be laid out in a centralized manner, which is beneficial to reduce cost and improve product yield.

Optionally, in an embodiment, each of the light-emitting branches includes one sub-millimeter light-emitting diode; alternatively, each of the light-emitting branches includes at least two sub-millimeter light-emitting diodes, wherein the at least two sub-millimeter light-emitting diodes are connected in parallel or in series. Therefore, the sub-millimeter light-emitting diodes can be used as a backlight source of the display device, so that the display device has the advantages of long life and not easy to burn screen.

In addition, another aspect of the present disclosure provides a display device, such as a display device using sub-millimeter light-emitting diodes as a backlight source or a direct display light source. For example, the display device includes a display screen and the light source module as mentioned above, wherein the light source module is connected to the display screen. The implementation content and beneficial effects of the light source module are described above, and will not be repeated. For example, the display device may be a liquid crystal display device that uses the light source module as a backlight source; alternatively, the display device may also be a Mini LED display that uses the light source module as a direct display light source, but is not limited to the description here.

Figure 5:
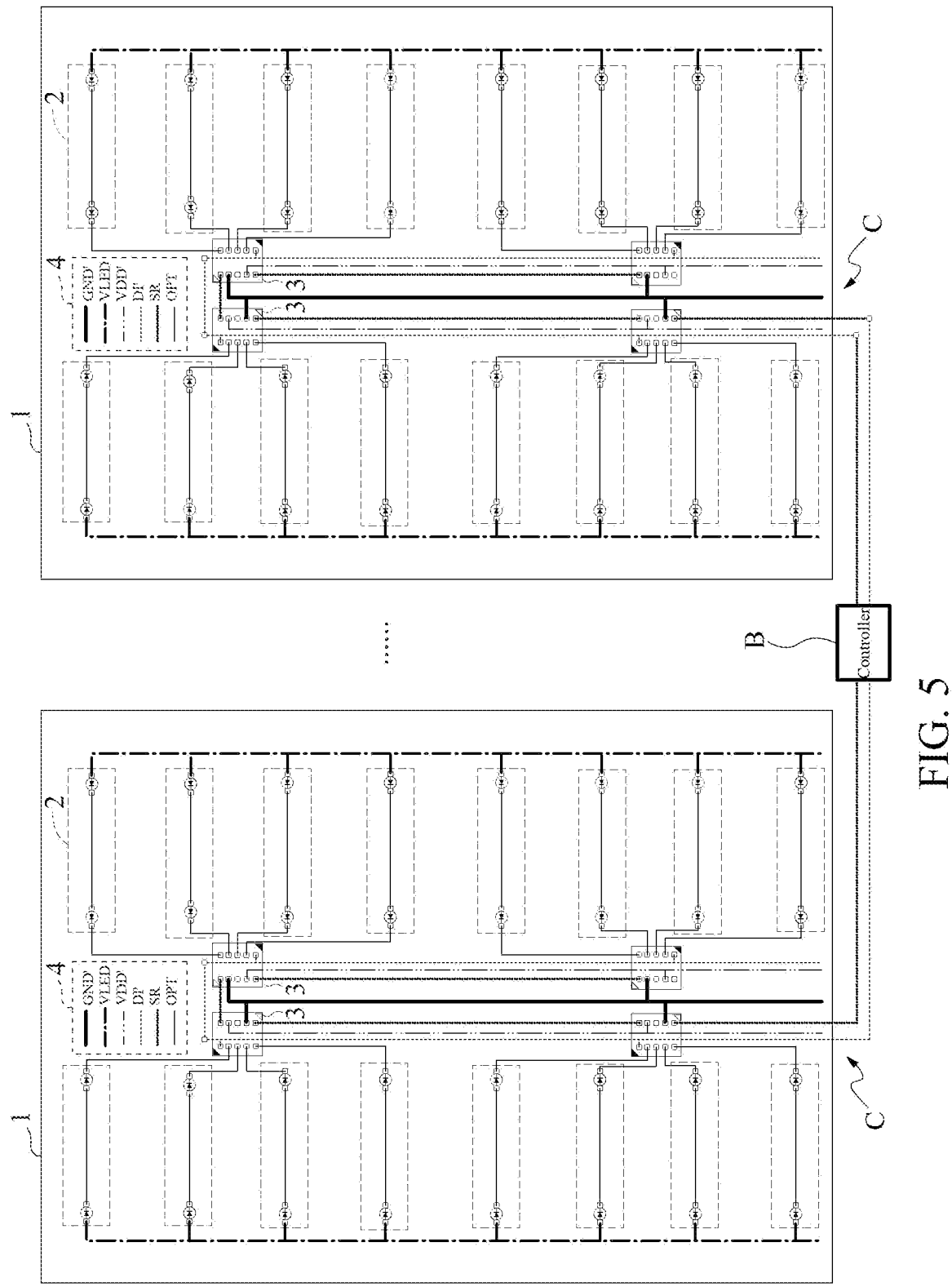
FIG. 5 is a schematic wiring diagram of a display device using a plurality of light source modules according to an embodiment of the present disclosure.

For example, in an application example, as shown in FIG. 5, the display device includes a plurality of light source modules C and a controller (Bcon) B. In order to simplify the description, only two light source modules (such as the embodiment of the light source module shown in FIGS. 1 and 2) are taken as an example for description but are not limited to the description here. In addition, the description can also be applied to the light source module shown in FIGS. 3 and 4.

Optionally, as shown in FIGS. 1, 2, and 5, each of the light source modules C includes a substrate 1. The substrate 1 is configured to have a plurality of light-emitting regions M arranged in an array manner, wherein each of the light-emitting regions M is provided with two light-emitting groups G. Each of the light-emitting groups G includes a plurality of light-emitting branches 2 arranged in parallel, two driving chips 3 are disposed in parallel between the two light-emitting groups G, and single-layer-layout wiring 4 is arranged on the substrate 1, to make the driving chips 3 in the light-emitting regions M be coupled to each other. In addition, each of the driving chips 3 drives the light-emitting branches 2 within one of the light-emitting groups G. Also, one of the driving chips 3 on the substrate 1 of each light source module C is coupled to the controller B.

For example, as shown in FIGS. 1, 2, and 5, one of the driving chips 3 close to the controller B on the substrate 1 can be configured as a specific driving chip 3 to be coupled to the controller B, For example, two function (shown as "SO," "DI") pins 30 and 39 of the specific driver chip 3 are coupled to the two corresponding pins of the controller B via a part of the single-layer-layout wiring 4. Thus, the controller B can control the driving chips 3 coupled to each other of the light source modules C. For example, the controller B performs data transmission (such as transmitting control commands) to the driving chips 3, to facilitate various light source control tasks to meet display requirements of the display device.

In the light source module and the display device of the above-mentioned embodiments of the present disclosure, the substrate is configured to have a plurality of light-emitting regions arranged in an array manner, each of the light-emitting regions is provided with two light-emitting groups, and each of the light-emitting groups includes a plurality of light-emitting branches arranged side-by-side, and two driving chips are disposed in parallel between the two light-emitting groups; and single-layer layout wiring is arranged on the substrate, wherein the single-layer layout wiring couples the driving chips within the light-emitting regions to each other and electrically connect each of the driving chips to the light-emitting branches within one of the light-emitting groups.

Therefore, the above-mentioned embodiments of the present disclosure can be backlight products with sub-millimeter light-emitting diodes driven by chips based on the design of single-layer metal wiring. For example, the two driving chips are centrally symmetrically arranged, wherein the ground pins of the two driving chips are close to each other, and the output pins are close to the light-emitting branches within one of the light-emitting groups. Compared with the light source module based on two or more layers of metal wiring in the prior art, the above-mentioned embodiments of the present disclosure can avoid problems of circuits easily shorted between different metal layers and high cost. It can not only reflect product competitiveness but also reduce costs and improve product yield.

The embodiments of the present disclosure are described in detail above, and specific examples are used herein to illustrate the principles and implementation modes of the present disclosure. The descriptions of the above embodiments are only used to help understand the technical solutions and core ideas of the present disclosure; those ordinarily skilled in the field should understand that they can still modify the technical solutions recorded in the foregoing embodiments, or equivalently replace some of the technical features, and these modifications or replacements do not divorce the essence of the corresponding technical solutions from the scope of the technical solution of various embodiments of the present disclosure.

What is claimed is:

1. A light source module, comprising:
a substrate configured to have a plurality of light-emitting regions arranged in an array manner, wherein each of the light-emitting regions of the substrate is provided with two light-emitting groups, each of the light-emitting groups comprises a plurality of light-emitting branches arranged side by side, and two driving chips are disposed in parallel between the two light-emitting groups; wherein the two driving chips are centrally symmetrically arranged; and
single-layer-layout wiring arranged on the substrate, wherein the single-layer-layout wiring couples the driving chips within each of the light-emitting regions to each other and electrically connects each of the driving chips to the light-emitting branches within one of the light-emitting groups; wherein each of the light-emitting branches comprises one sub-millimeter light-emitting diode, alternatively, each of the light-emitting branches comprises at least two sub-millimeter light-emitting diodes, wherein the at least two sub-millimeter light-emitting diodes are connected in parallel or in series.

2. The light source module as claimed in claim 1, wherein each of the driving chips comprises a ground pin, at least one power pin, a variety of function pins, and a plurality of output pins, wherein two ground pins of the two driving chips within each of the light-emitting regions are close to each other, and the output pins are close to the light-emitting branches within one of the light-emitting groups.

3. The light source module as claimed in claim 2, wherein the single-layer-layout wiring is configured to make each of the output pins within each of the light-emitting regions be coupled to one end of one of the light-emitting branches within a same light-emitting region, another end of each of the light-emitting branches within each of the light-emitting regions be coupled to each other, the ground pin within each of the light-emitting regions be coupled to each other, the power pin within each of the light-emitting regions be coupled to each other, and same or corresponding function pins within the light-emitting regions be respectively coupled.

4. The light source module as claimed in claim 2, wherein the light-emitting branches are arranged side by side in a first direction, the single-layer-layout wiring is further configured to form a ground wire part, and the ground wire part extends in the first direction between the two driving chips to be coupled to the ground pins within each of the light-emitting regions.

5. The light source module as claimed in claim 4, wherein the single-layer-layout wiring is further configured to form two light source wire parts, and each of the light source wire parts extends in the first direction on one side of each of the light-emitting groups away from the driving chips to be coupled to the light-emitting branches within each of the light-emitting regions.

6. The light source module as claimed in claim 5, wherein the single-layer-layout wiring is further configured to form two power wire parts, and each of the power wire parts extends in the first direction between the ground wire part and one of the light source wire parts to be coupled to the power pins within each of the light-emitting regions.

7. The light source module as claimed in claim 4, wherein the single-layer-layout wiring is further configured to form a variety of function wire parts, and the function wire parts extend in the first direction between the two light-emitting groups to be coupled to same or corresponding function pins within the light-emitting regions.

8. A light source module, comprising:
a substrate configured to have a plurality of light-emitting regions arranged in an array manner, wherein each of the light-emitting regions of the substrate is provided with two light-emitting groups, each of the light-emitting groups comprises a plurality of light-emitting branches arranged side by side, and two driving chips are disposed in parallel between the two light-emitting groups; and
single-layer-layout wiring arranged on the substrate, wherein the single-layer-layout wiring couples the driving chips within each of the light-emitting regions to each other and electrically connects each of the driving chips to the light-emitting branches within one of the light-emitting groups;
wherein each of the light-emitting branches comprises one sub-millimeter light-emitting diode; alternatively, each of the light-emitting branches comprises at least two sub-millimeter light-emitting diodes, wherein the at least two sub-millimeter light-emitting diodes are connected in parallel or in series.

9. The light source module as claimed in claim 8, wherein each of the driving chips comprises a ground pin, at least one power pin, a variety of function pins, and a plurality of output pins, wherein two ground pins of the two driving chips within each of the light-emitting regions are close to each other, and the output pins are close to the light-emitting branches within one of the light-emitting groups.

10. The light source module as claimed in claim 9, wherein the single-layer-layout wiring is configured to make each of the output pins within each of the light-emitting regions be coupled to one end of one of the light-emitting branches within a same light-emitting region, another end of each of the light-emitting branches within each of the light-emitting regions be coupled to each other, the ground pin within each of the light-emitting regions be coupled to each other, the power pin within each of the light-emitting regions be coupled to each other, and same or corresponding function pins within the light-emitting regions be respectively coupled.

11. The light source module as claimed in claim 9, wherein the light-emitting branches are arranged side by side in a first direction, the single-layer-layout wiring is further configured to form a ground wire part, and the ground wire part extends in the first direction between the two driving chips to be coupled to the ground pins within each of the light-emitting regions.

12. The light source module as claimed in claim 11, wherein the single-layer-layout wiring is further configured to form two light source wire parts, and each of the light source wire parts extends in the first direction on one side of each of the light-emitting groups away from the driving chips to be coupled to the light-emitting branches within each of the light-emitting regions.

13. The light source module as claimed in claim 12, wherein the single-layer-layout wiring is further configured to form two power wire parts, and each of the power wire parts extends in the first direction between the ground wire part and one of the light source wire parts to be coupled to the power pins within each of the light-emitting regions.

14. The light source module as claimed in claim 11, wherein the single-layer-layout wiring is further configured to form a variety of function wire parts, and the function wire parts extend in the first direction between the two light-emitting groups to be coupled to same or corresponding function pins within the light-emitting regions.

15. The light source module as claimed in claim 8, wherein the two driving chips are centrally symmetrically arranged.

16. A display device comprising a display screen and the light source module as claimed in claim 8, wherein the light source module is connected to the display screen.

\* \* \* \* \*